(12) United States Patent
Sims et al.

(10) Patent No.: US 6,512,678 B2
(45) Date of Patent: Jan. 28, 2003

(54) DISTRIBUTED LOAD BOARD STIFFENER

(75) Inventors: Rob W. Sims, Tacoma, WA (US); Uppalapati V. Ramgopal, Tacoma, WA (US); Ronald C. Flamm, Olympia, WA (US); Michael Z. Eckblad, Auburn, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/823,870

(22) Filed: Mar. 30, 2001

(65) Prior Publication Data

US 2002/0141165 A1 Oct. 3, 2002

(51) Int. Cl.$^7$ .............................. H05K 7/00; H05K 7/12
(52) U.S. Cl. .................. 361/759; 361/801; 361/807; 248/560
(58) Field of Search ................................. 361/752, 753, 361/759, 801, 807–810; 248/560, 200, 221.11

(56) References Cited

U.S. PATENT DOCUMENTS

| | | | | |
|---|---|---|---|---|
| 5,490,038 A | * | 2/1996 | Scholder et al. | 174/50 |
| 5,623,396 A | * | 4/1997 | Blackwell | 361/759 |
| 6,260,265 B1 | * | 7/2001 | Kownacki et al. | 174/135 |

* cited by examiner

*Primary Examiner*—Jayprakash N. Gandhi
(74) *Attorney, Agent, or Firm*—Blakely, Sokoloff, Taylor & Zafman LLP (57) ABSTRACT

An apparatus, and method for using same, is described for a distributed load board stiffener. The apparatus may include a body having a central axis portion and multiple protusions extending away from the central axis portion towards respective ends. Each of the ends of the protrusions having a mounting point to mount a printed circuit board to a chassis support. The protrusions may operate to mount the board stiffener to a printed circuit board away from trace routing areas disposed centrally on the printed circuit board. The protrusions may operate to distribute a load around a periphery of the printed circuit board.

31 Claims, 11 Drawing Sheets

DISTRIBUTED LOAD BOARD STIFFENER

FIELD OF THE INVENTION

The present invention relates to the field of electronic equipment and, in particular, to the circuit boards that are used within electronic equipment.

BACKGROUND OF THE INVENTION

A printed circuit board (PCB) is a board upon which a layer of metallic traces are routed. PCBs are typically constructed of epoxy resin and copper, however, a variety of other materials may be used. As circuits increase in complexity, PCBs are being developed into multiple layer boards with each layer forming trace planes on the board. The routing traces of these layers may be soldered to integrated circuits and/or board connectors.

A pair of connectors may be used to connect two PCBs together. A typical connector pair includes a header and a receptacle, each including a plastic housing and multiple contact elements. The complementary formed header and receptacle fit together such that the electrical contacts of the header are aligned with the electrical contacts of the receptacle. In this manner, a connector pair completes an electrical circuit between two PCBs. The connector pair must fit and remain properly coupled such that an acceptable electrical connection is established.

PCBs are extensively used within electronic equipment, such as computer systems. Examples of PCBs include a motherboard, a daughterboard, a backplane, a midplane, etc. During manufacturing of a PCB, the board may assume a warped or non-planar configuration that may be the result of various manufacturing, handling, and installation problems. During some manufacturing processes such as soldering, the PCB and the components and connectors soldered thereon are subjected to high temperatures. These high temperatures may warp or bend the PCB to some extent.

Moreover, PCBs are typically manufactured very thin and, thus, suffer from a lack of structural stability. The thinness of a PCB may make the PCB vulnerable to deflection resulting from shock, vibration, and connector insertion loads that may damage or break the solder connections and/or loosen the connector pair couplings. For example, a PCB may be exposed to upwards of 96 lbs of insertion force depending on the size and type of connectors on the PCB. In addition, during use, thin PCBs may bend simply because of the weight placed on them, especially for larger size PCBs. As a result, the deflection of a PCB may reduce the reliability of electrical connections between connector pairs and/or circuits on the board.

Figure 1A:
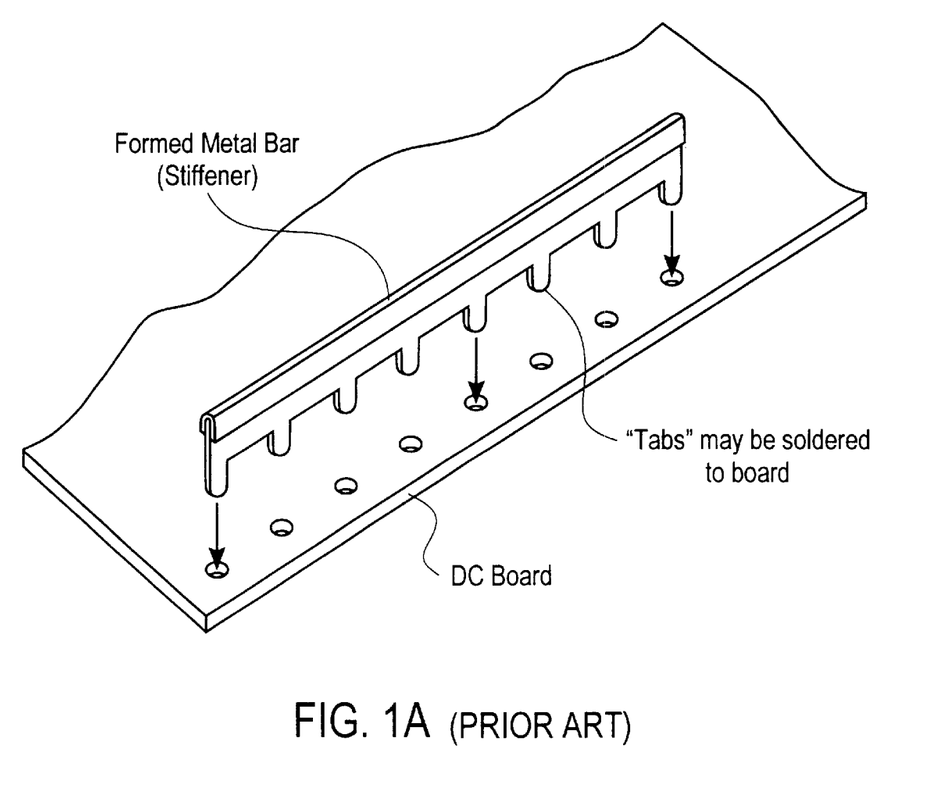
FIG. 1A illustrates a prior board stiffener.
Figure 1B:
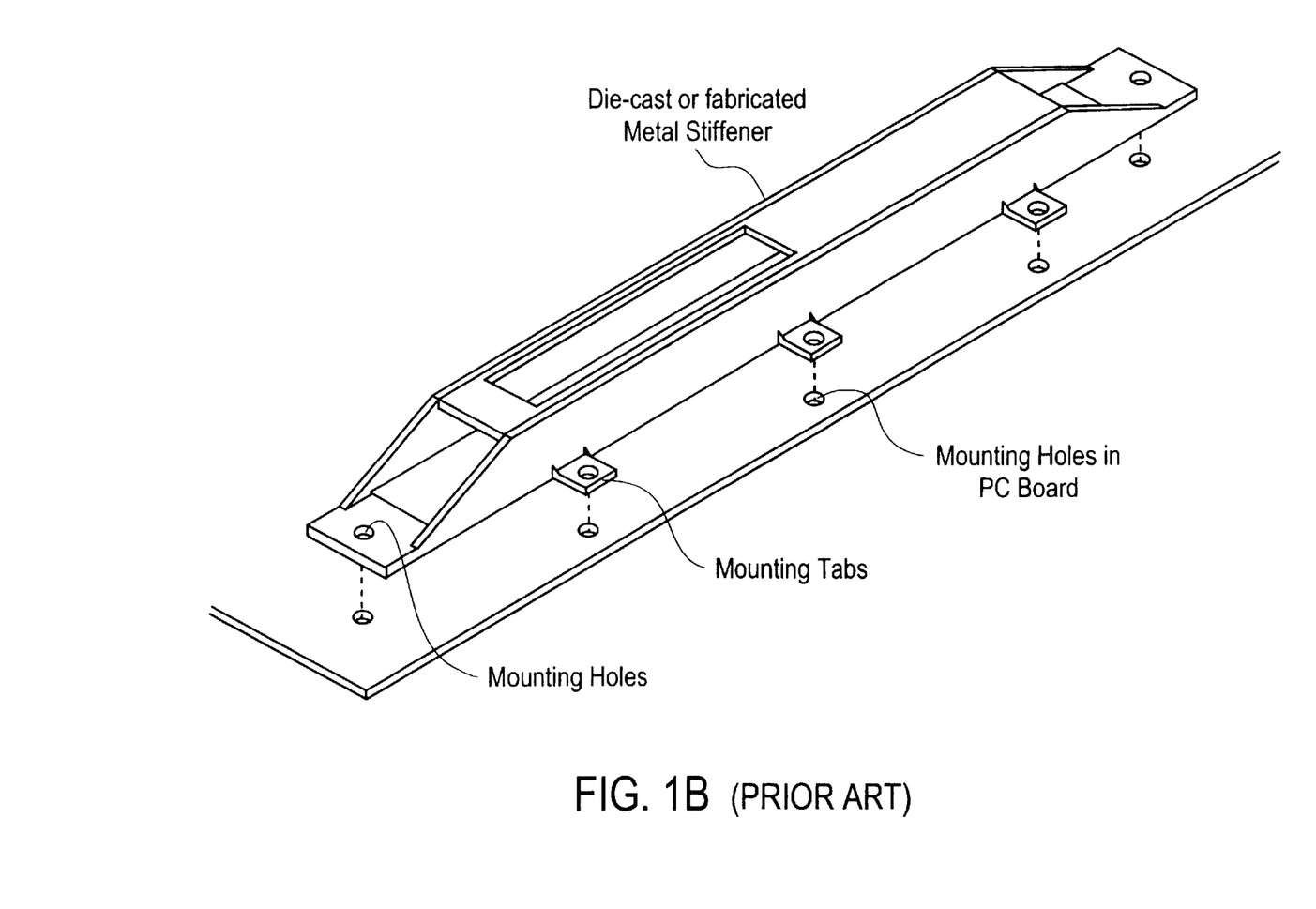
FIG. 1B illustrates another prior board stiffener.
Figure 1C:
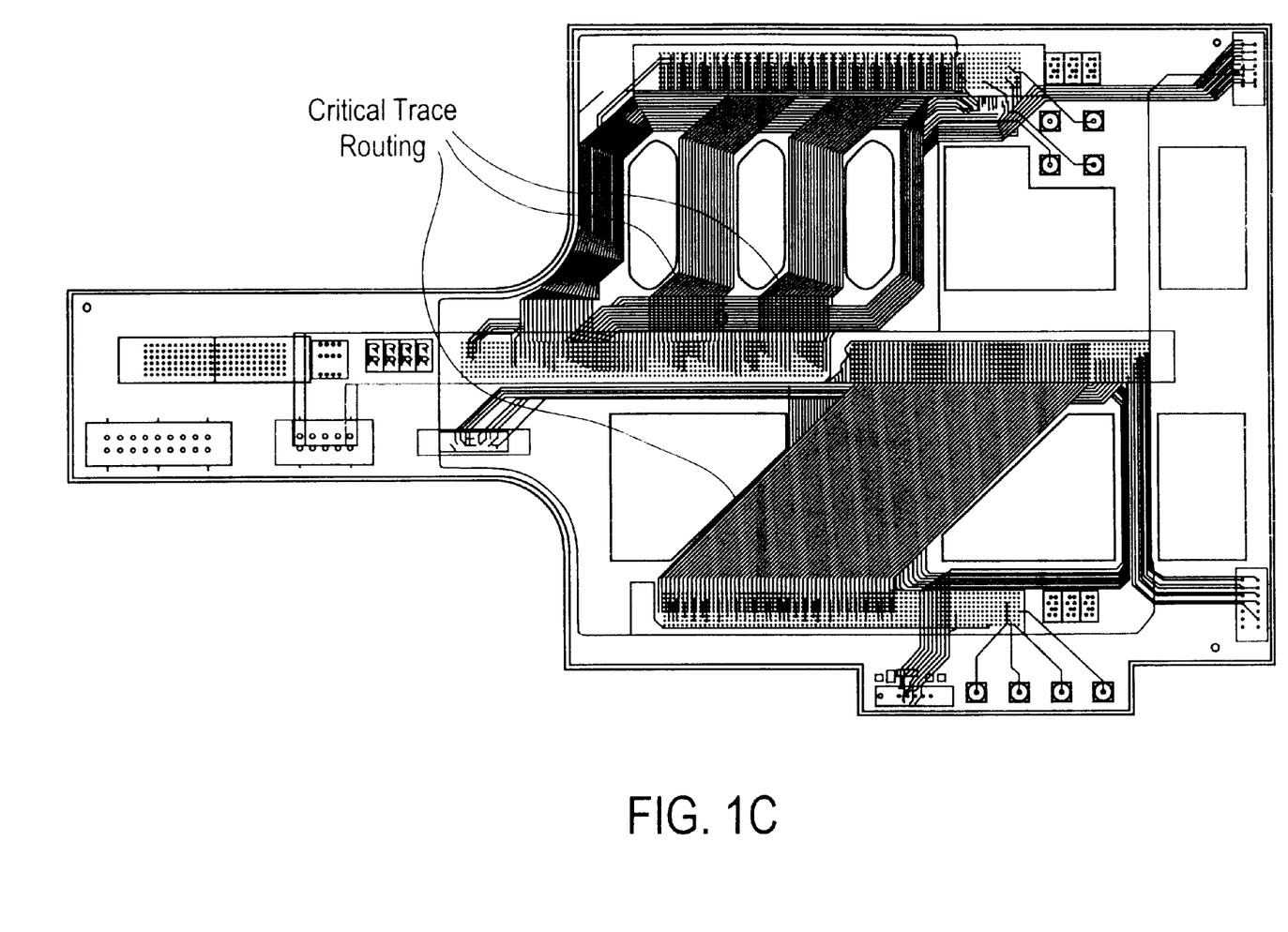
FIG. 1C illustrates one embodiment of the tracings on a printed circuit board.
Figure 1D:
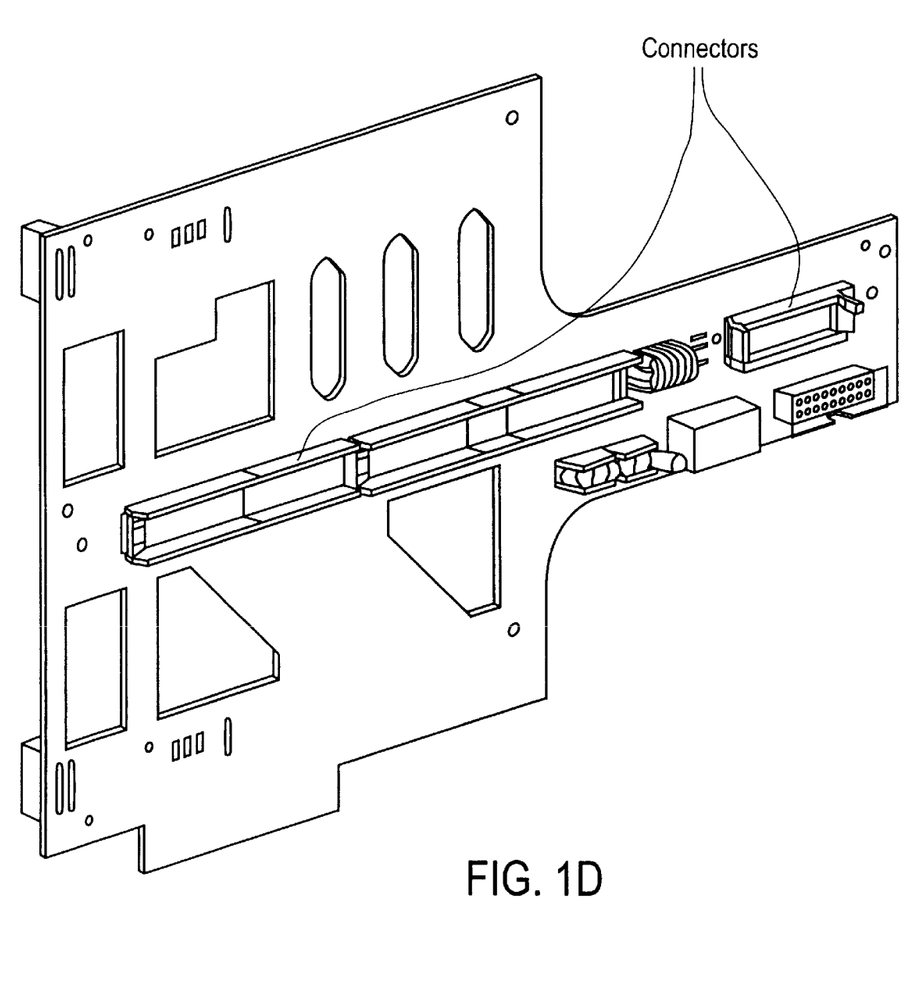
FIG. 1D illustrates one embodiment of connectors on a printed circuit board.

One solution is to install a board stiffener to reduce the amount of board deflection. FIG. 1A illustrates a prior board stiffener that consists of a formed metal bar that has multiple tabs that are soldered to a PCB. FIG. 1B illustrates another fabricated metal stiffener that has multiple tabs that mount to a PCB. One problem with using such board stiffeners is that PCBs may have routing traces that are predominately located along the midpoint of the board and, thus, consume most of the available space in that area, as illustrated in FIG. 1C. This reduces the available connection points for structural support. In addition, the number and location of mounting holes for stiffeners may be limited due to the size of the connectors, as illustrated by FIG. 1D, as well as the internal trace routing of the PCB.

Yet another problem with formed metal stiffeners is that the use of pins to attach the stiffener to the PCB requires soldering. As previously mentioned, soldering subjects the board to high temperatures that may warp or bend the PCB to some extent. Furthermore, soldering stiffeners to boards adds manufacturing expense and complexity. Formed metal stiffeners may also have limited structural capability due to size limitation. In addition, the use of screws to attach the stiffener to the PCB may also result in problems such as lost screws in the chassis and/or impact damage to the PCB and/or PCB components from screwdrivers that slip off screw heads.

Another problem with using the board stiffeners of FIGS. 1A and 1B is that they may not provide enough structural support for connectors that are located at the periphery of a PCB. One solution is to install multiple elongate bars across the upper, middle, and bottom sections of a PCB. A problem with such a solution is that the use of multiple elongate bars adds considerable expense to manufacturing costs. Another problem is that the mounting of multiple elongate bars requires separate manufacturing steps which adds both considerable time and cost to the manufacture of electronic equipment containing PCBs with such stiffeners.

BRIEF DESCRIPTION OF THE DRAWINGS

The present invention is illustrated by way of example, and not by way of limitation, in the figures of the accompanying drawings and in which.

DETAILED DESCRIPTION

In the following description, numerous specific details are set forth such as examples of specific machines, boards, components, materials, etc. in order to provide a thorough understanding of the present invention. It will be apparent, however, to one skilled in the art that these specific details need not be employed to practice the present invention. In other instances, well known components or methods have not been described in detail in order to avoid unnecessarily obscuring the present invention.

A board stiffener and method for using same is described. In one embodiment, the board stiffener may include a body having a central axis portion and a plurality of protrusions extending away from the central axis portion towards respective ends. Each of the ends of the plurality of protrusions having a mounting point to mount a printed circuit board to a chassis support. The plurality of protrusions may operate to mount the board stiffener to a printed circuit board away from trace routing areas disposed centrally on the printed circuit board. The plurality of protrusions may also operate to distribute a load around a periphery of the printed circuit board.

Figure 2A:
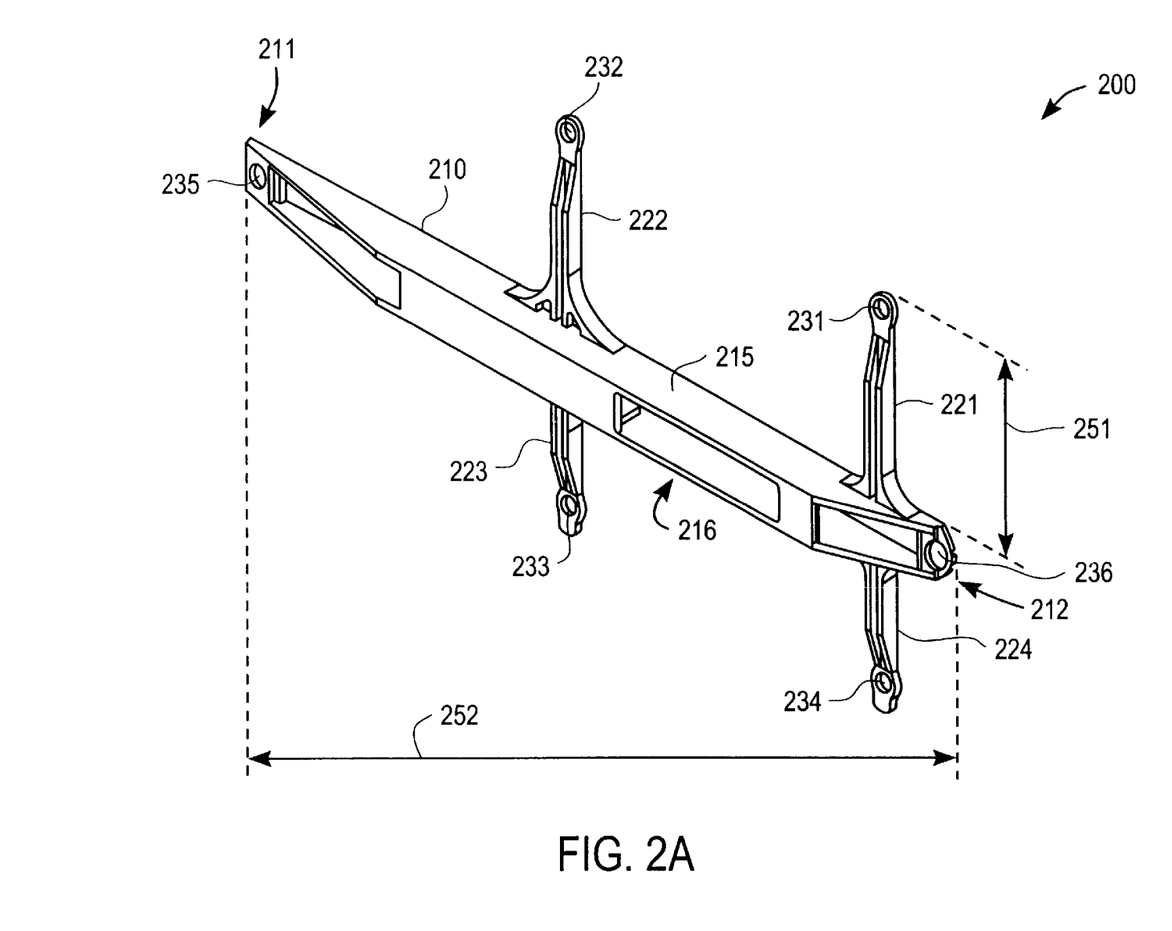
FIG. 2A illustrates one embodiment of a board stiffener.

FIG. 2A illustrates one embodiment of a board stiffener. In one embodiment, board stiffener 200 comprises a body having a central axis portion 210 that extends from end 211 to end 212. Board stiffener 200 may also include one or more protrusions, for example, protrusions 221–224. Four protrusions 221–224 are shown for ease of illustration. In an alternative embodiment, board stiffener 200 may have less or more than four protrusion.

Protrusions 221–224 are disposed along central axis portion 210 and extend away from central axis portion 210 towards respective ends 231–234 of protrusions 221–224. In one embodiment, protrusions 222 and 223 are disposed on opposite sides 215 and 216 of central axis portion 210 at approximately the midpoint of central axis portion 210. In one embodiment, protrusions 221 and 224 are disposed on opposite sides 215 and 216 of central axis portion 210 approximately at end 212. In alternative embodiments, one or more of protrusions 221–224 may be disposed along central axis portion 210 at other locations along length 252 and extend away in other configurations. For example, protrusions 222 and 223 may be disposed on opposite sides 215 and 216 of central axis portion 210 approximately at end 212. In another embodiment, for another example, protrusions 221–224 may each be disposed at approximately the mid-point of central axis portion 210 and extend away at approximately 45 degrees in a star formation.

Protrusions 221–224 may be integrally formed with central axis portion 210 or, alternatively, may be detachably coupled to central axis portion 210. In one embodiment, length 252 of central axis portion 210 is greater than the lengths of protrusion 221–224 (e.g., length 251 of protrusion 221). Protrusions 221–224 may have similar or different lengths with respect to each other.

Figure 2B:
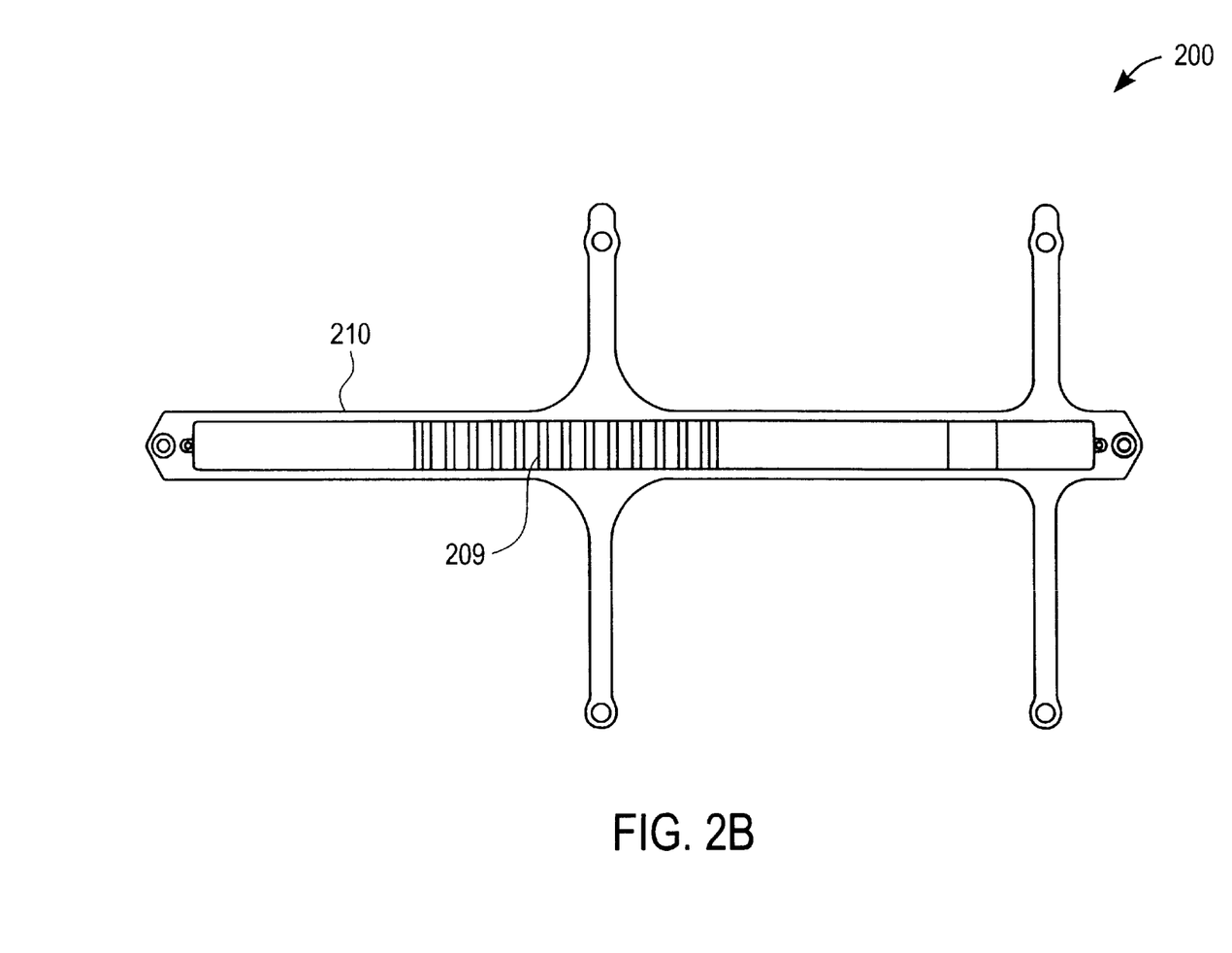
FIG. 2B is a back side view of the embodiment of the board stiffener illustrated in FIG. 2A.

In one embodiment, body 210 may be constructed of aluminum. In an alternative embodiment, other rigid materials may be used, for examples, steel and plastic. In one embodiment, the body 210 may include ribbing 209 on its back side, as illustrated in FIG. 2B, to distribute force towards the protrusions.

Protrusions 221–224 each have a mounting point (e.g., a hole) 231–234, respectively, and central axis portion 210 has mounting points 235 and 236 at ends 211 and 212, respectively. Mounting points 231–236 may be used in conjunction with fasteners to mount board stiffener 200 to a board as discussed below in relation to FIGS. 3 and 4.

Figure 3:
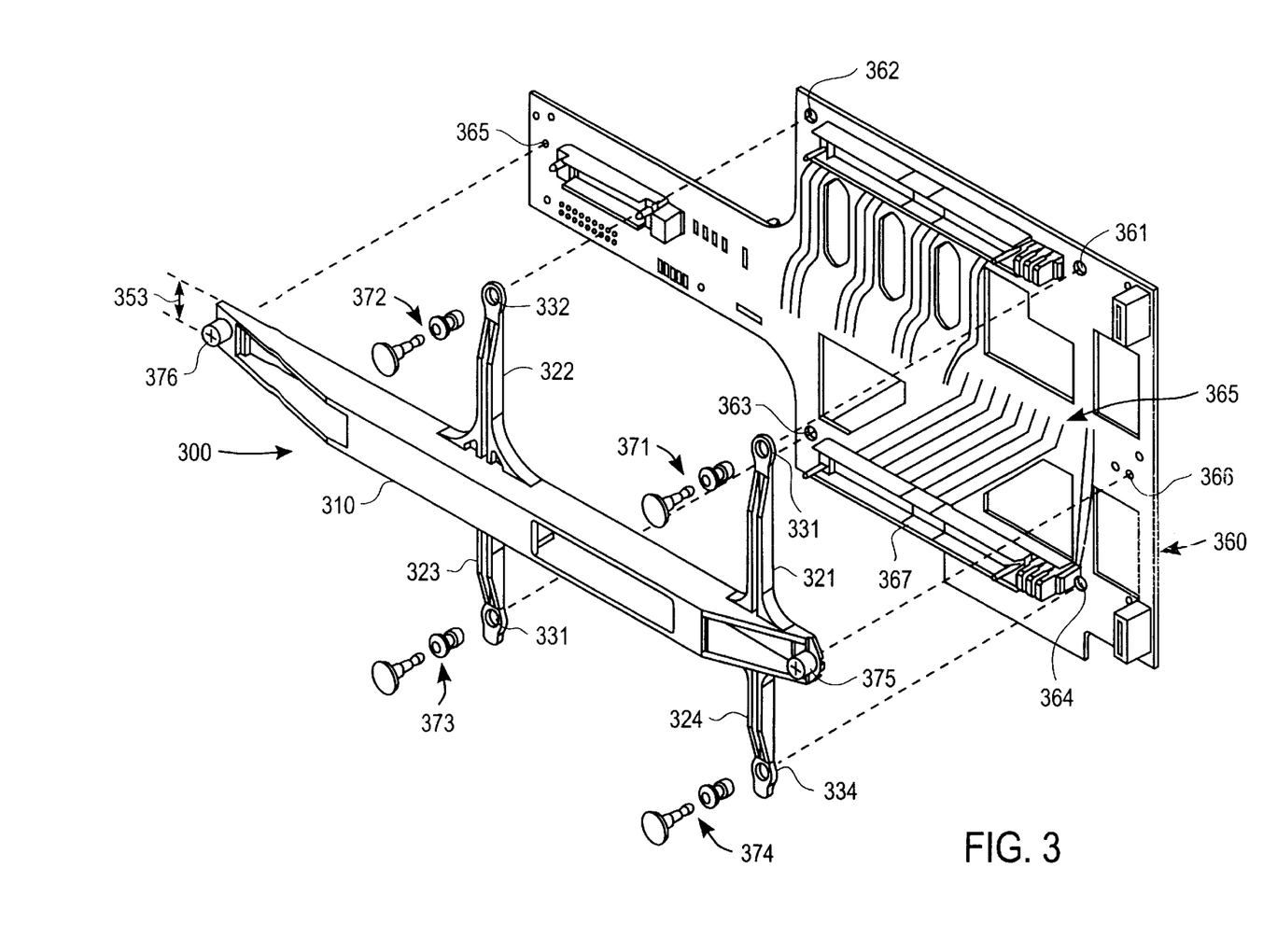
FIG. 3 is an exploded view illustrating one embodiment of a board stiffener and a printed circuit board.

FIG. 3 is an exploded view illustrating one embodiment of a board stiffener and a printed circuit board. In one embodiment, PCB 360 may be a midplane board. In an alternative embodiment, PCB 360 may be another type of printed circuit board, for examples, a daughter board, a motherboard, and a backplane board. In one embodiment, stiffener 300 may be stiffener 200 of FIG. 2A.

Figure 4:
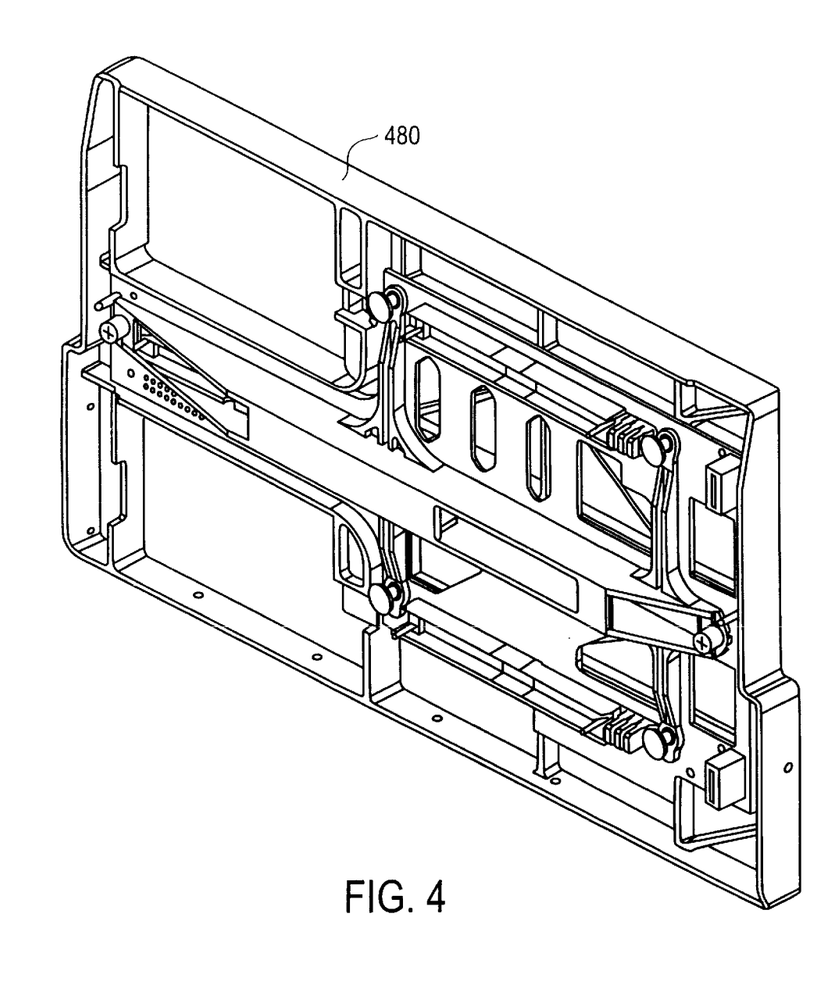
FIG. 4 illustrates one embodiment of a board stiffener coupled to a printed circuit board.
Figure 7:
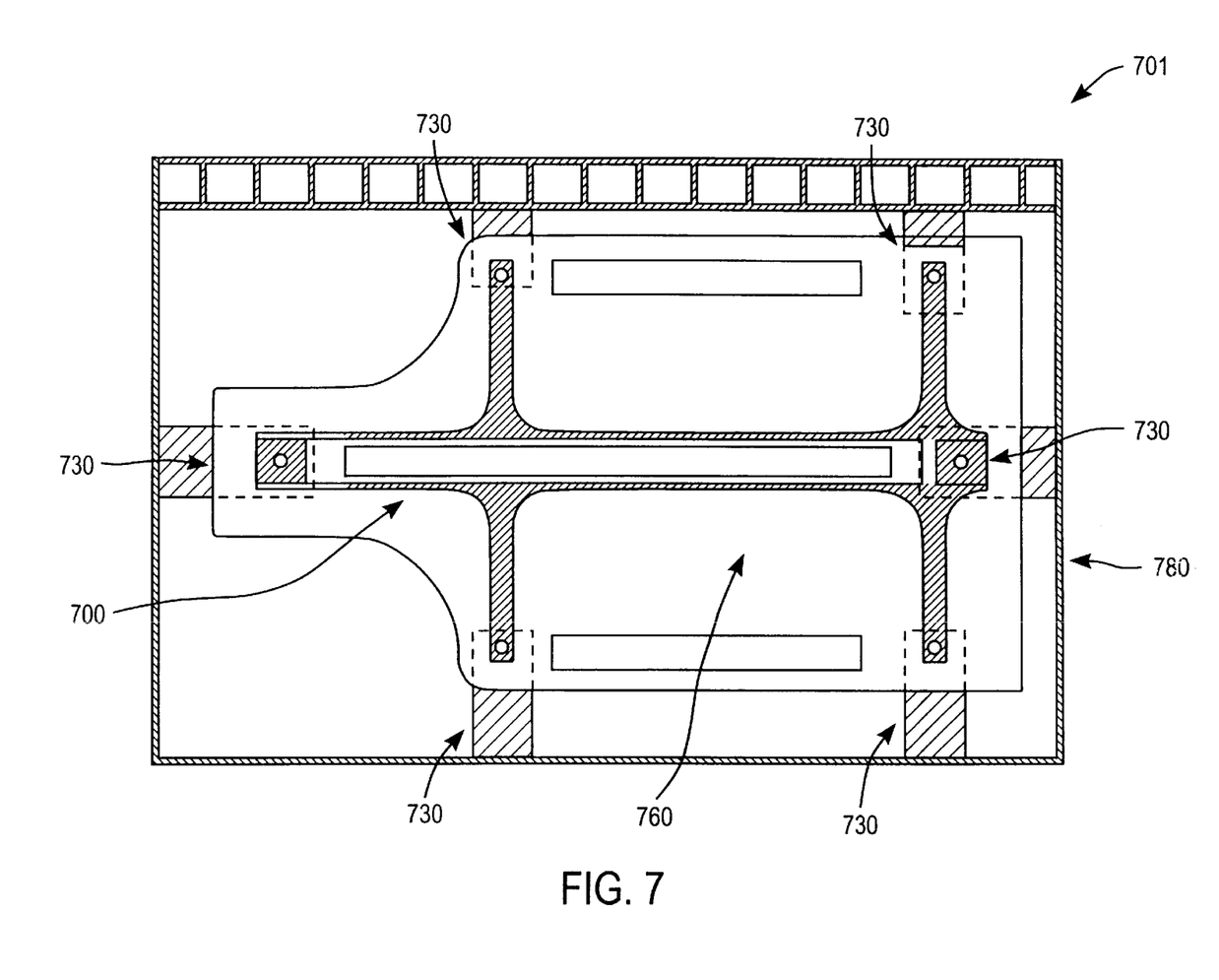
FIG. 7 illustrates one embodiment of a mounting structure to receive a board stiffener.

Stiffener 300 may be used to mount PCB 360 to a mounting structure (e.g., chassis support 480 of FIG. 4 or fastening locations 730 within electronic equipment of FIG. 7). PCB 360 includes connectors (e.g., connector 367 and connector 366 located on the back side of board, thus not illustrated) and trace routings 365 disposed in approximately the central area of PCB 360. By using multiple mounting locations around the periphery of PCB 360, the deflection of PCB 300 may be minimized, while reducing the need to reroute traces to accommodate central mounts.

In an exemplary embodiment, for PCB 360 having the approximate dimensions of a 0.093 inch thickness and a 14 inch length, numerical structural analysis indicated that six mounting locations may be used to maintain PCB 360 deflection under 0.020 inches. For this exemplary embodiment, mounting holes 361–366 may be used in conjunction with fasteners, discussed below, to secure stiffener 300 to PCB 360.

From a structural standpoint, although it may be advantageous to locate the mounting points as close to the central axis portion of stiffener 310 as possible, internal trace routings 365 on board 360 may prevent placement of mounting points immediately adjacent to the central axis portion of stiffener 310. As such, mounting points 361–366 may be disposed on PCB 360 away from trace routings 365 with mounting points 331–336 correspondingly disposed on protrusion 321–326. In addition, by locating mounting points 361–366 and 331–336 away from the central area of PCB 360, the loading of a central area connector (e.g., connector 366) may be distributed to the perimeter of PCB 360. Such a distributed load may allow for unencumbered trace routing 365 in the critical areas adjacent connectors (e.g., connector 366). In this manner, routing may be greatly simplified while maintaining structural integrity of PCB 360.

In addition, the distribution of load on PCB 360 by protrusions 321–324 enables the height 353 of the central axis portion 310 of the stiffener 300 to be minimized. In one embodiment, for example, height 353 may be approximately 0.90 inches when stiffener 300 is used to secure a printed circuit board 360 having a length of approximately 14 inches.

Stiffener 300 may be secured to PCB 360 using fasteners 371–376. One or more of fasteners 371–376 may be plungers with grommets. Alternatively, other types of fasteners may be used such as screws and nuts/bolts. In one embodiment, for example, fasteners 375 and 376 may be of a screw type fastener while fasteners 371–374 may be of the plunger/grommet type. The plunger/grommet fasteners may be multiple piece fasteners as illustrated in FIG. 3 or, alternatively, the plunger and grommet may be integrated into a single piece unit.

In one embodiment, where mounting points 331–336 are holes, PCB 360 may be secured in the following manner. First, fasteners 371–376 may be inserted through mounting points 331–336 to engage stiffener 300. Fasteners 371–376 may then be inserted through mounting holes 361–366 to engage PCB 360. Next, fasteners 371–376 may be coupled to chassis support 480, as illustrated by FIG. 4.

Figure 5:
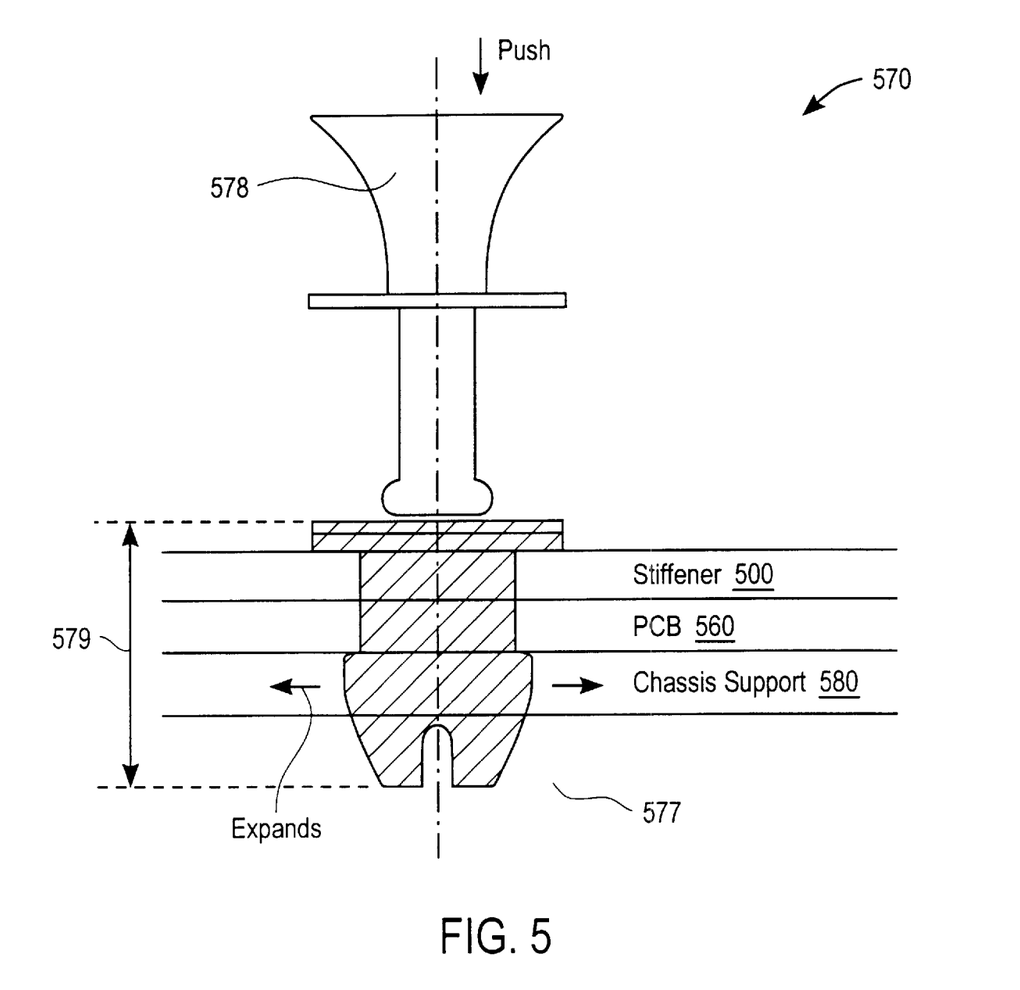
FIG. 5 is a cross-section illustrating one embodiment of a fastener engaged with a stiffener, a PCB, and a casting.

FIG. 5 is a cross-section illustrating one embodiment of a fastener engaged with a stiffener, a PCB, and a chassis support. In one embodiment, fastener 570 includes a plunger section 578 and a grommet section 579. Plunger section 578 is designed to receive an application of force, for example, pushed on by a person or a robotic arm performing component assembly. Grommet section 579 is designed to secure, for example, stiffener 500 to PCB 560 and PCB 560 to casting 580. The grommet section 579 may also include a mid-section to engage a stiffener 500 and PCB 560, and a deformable end 577 to engage chassis support 580.

The deformable end 577 is configured to deform during insertion into chassis support 580 and then expand to engage chassis support 580. In this manner, stiffener 500 may be coupled to PCB 560 prior to PCB 560 coupling to chassis support 580. This may allow for testing of PCB 560 prior to assembly in a piece of electronic equipment, as discussed below.

In one embodiment, fastener 570 may be constructed from a nylon material. In an alternative embodiment, fastener 570 may be constructed from other materials with deformable end 577 constructed of a resilient material, such as carbon fiber.

Figure 6:
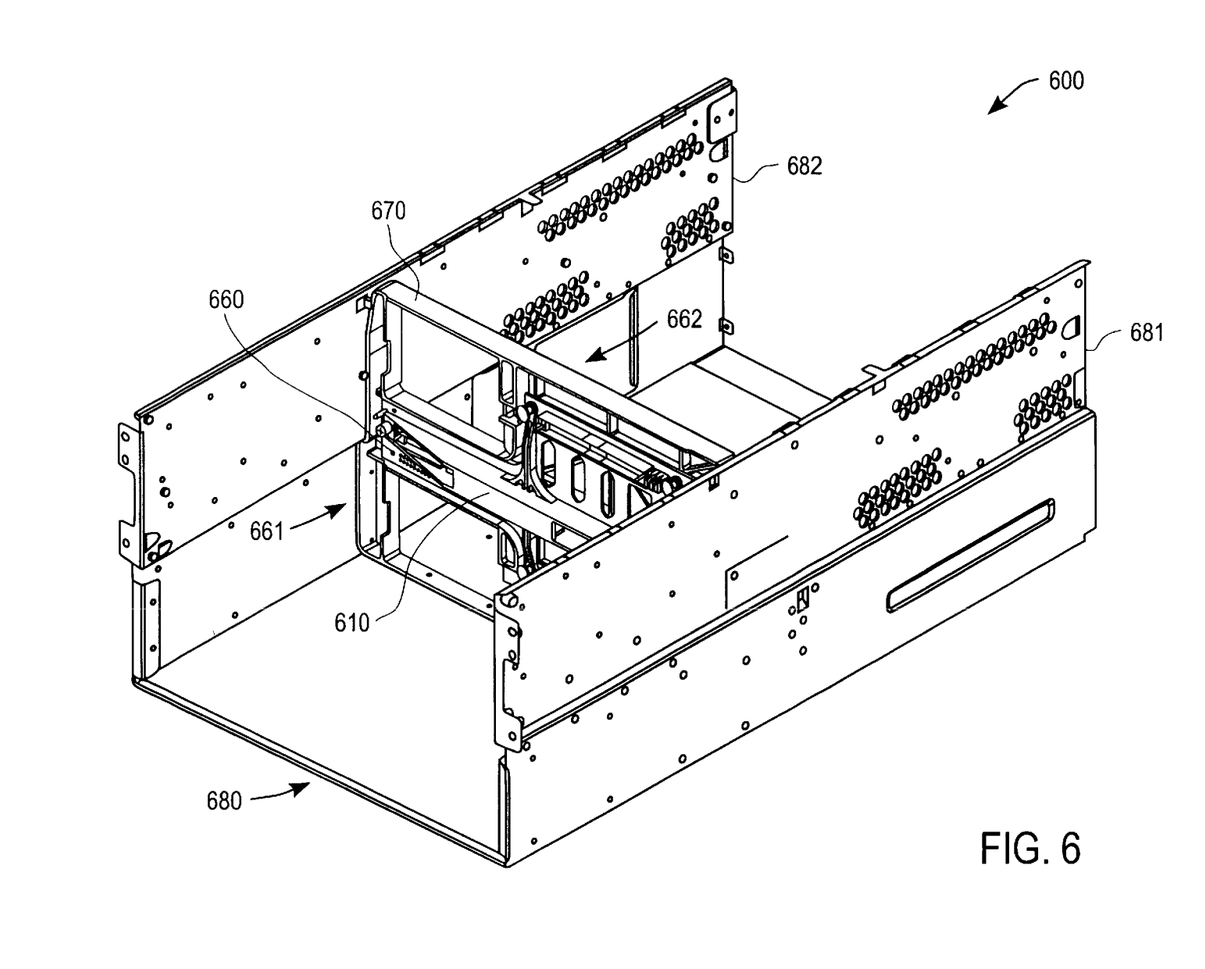
FIG. 6 illustrates one embodiment of an electronic equipment chassis containing a board stiffener.

FIG. 6 illustrates one embodiment of electronic equipment containing a PCB stiffener. Electronic equipment may be, for examples, a personal computer, a server, or a test/measurement unit. Electronic equipment 600 includes chassis 680, support 670, PCB 660, and stiffener 610. Support 670 is disposed between sides 681 and 682 of chassis 680. Although support 670 is illustrated as spanning approximately the mid-section of chassis 680, support 670 may be disposed between sides 681 and 682 along other locations of chassis 680.

Stiffener 610 operates in conjunction with support 670 to secure PCB 660, where PCB 660 is captured between support 670 and stiffener 610. Stiffener 610 is in physical contact with the primary side 661 of PCB 660 around the periphery of PCB 660. Support 670 is in physical contact with the secondary side 662 of PCB 660 around the periphery of PCB 660. By using fastener 570 of FIG. 5, stiffener 610 may be pre-mounted to PCB 660 prior to assembly within electronic equipment 600. This allows PCB 660 to be tested after mounting to stiffener 610, but before mounting to casting 670, to ensure that PCB 660 is not damaged before further assembly.

FIG. 7 illustrates one embodiment of a mounting structure to receive a board stiffener. In one embodiment, mounting structure 730 may include chassis mounting points on chassis 780 of electronic equipment 701. The mounting points 730 may be used to secure stiffener 700 directly to chassis 780, rather than a support spanning between the sides of a chassis.

The stiffener described herein may provide the rigidity needed for a PCB while locating the stiffener mounting features outside of the critical trace routing areas of a PCB.

In the foregoing specification, the invention has been described with reference to specific exemplary embodiments thereof. It will, however, be evident that various modifications and changes may be made thereto without departing from the broader spirit and scope of the invention as set forth in the following claims. The specification and drawings are, accordingly, to be regarded in an illustrative sense rather than a restrictive sense.

What is claimed is:

1. An apparatus, comprising:
a body having a central axis portion and a plurality of protrusions each having an end, wherein the plurality of protrusions extend away from the central axis portion towards their respective ends, each of the ends of the plurality of protrusions having a mounting point to mount a printed circuit board to a mounting structure.

2. The apparatus of claim 1, wherein the plurality of protrusions operate to distribute a load around a periphery of the printed circuit board.

3. The apparatus of claim 2, wherein the body has four protrusions extending away from the central axis.

4. The apparatus of claim 3, wherein the central axis portion has a first and second ends, each of the first and second ends having the mounting point.

5. The apparatus of claim 2, wherein the plurality of protrusions are integrally formed with the central axis portion in a unitary body.

6. The apparatus of claim 2, wherein the plurality of protrusions are detachably coupled to the central axis portion.

7. The apparatus of claim 2, wherein a first pair of the plurality of protrusions extend away from approximately the middle of the central axis portion.

8. The apparatus of claim 7, wherein a second pair of the plurality of protrusions extend away from approximately an end of the central axis portion.

9. The apparatus of claim 2, wherein the mounting structure is a chassis support.

10. The apparatus of claim 2, wherein the central axis portion is constructed of aluminum.

11. The apparatus of claim 1, further comprising a plurality of fasteners to mount the ends of the plurality of protrusions to the printed circuit board at each of the mounting points.

12. The apparatus of claim 11, wherein the plurality of fasteners comprise a plunger to receive an application of force and a grommet to secure the stiffener and the printed circuit board at the mounting points.

13. The apparatus of claim 11, wherein the grommet comprises a mid section to engage the stiffener and the printed circuit board, and a deformable end to engage the mounting structure.

14. The apparatus of claim 1, wherein the plurality of protrusions comprises four protrusions.

15. The apparatus of claim 1, wherein the body has a back side that includes ribbing to distribute force towards the plurality of protrusions.

16. The apparatus of claim 1, wherein at least one of the plurality of protrusions has a first length greater than a second length of a corresponding one of the mounting points.

17. An apparatus, comprising:
a chassis support;
a printed circuit board coupled to the chassis support, the printed circuit board having trace routings disposed in approximately a central area of the printed circuit board; and
a board stiffener coupled to the printed circuit board and the chassis support, the board stiffener comprising
a body having a central axis portion and a plurality of protrusions each having an end, wherein the plurality of protrusions extend away from the central axis portion towards their respective ends, each of the ends of the plurality of protrusions having a mounting point to mount a printed circuit board to the chassis support.

18. The apparatus of claim 17, wherein the plurality of protrusions are coupled to the printed circuit board outside of the central area.

19. The apparatus of claim 18, wherein the plurality of protrusions operate to distribute a load around a periphery of the printed circuit board.

20. The apparatus of claim 18, wherein the plurality of protrusions are integrally formed with the central axis portion to form a unitary body.

21. The apparatus of claim 18, wherein a first pair of the plurality of protrusions extend away from approximately the middle of the central axis portion.

22. The apparatus of claim 18, wherein a second pair of the plurality of protrusions extend away from approximately an end of the central axis portion.

23. The apparatus of claim 17, wherein at least one of the plurality of protrusions has a first length greater than a second length of a corresponding one of the mounting points.

24. A method, comprising:
distributing a plurality of mounting points around a periphery of a printed circuit board to redistribute a load on the printed circuit board outside of trace routing areas of the printed circuit board; and securing the printed circuit board between a chassis support and a stiffener using the plurality of mounting points.

25. The method of claim 24, wherein securing comprises coupling the stiffener to the printed circuit board prior to coupling the printed circuit board to the chassis support.

26. The method of claim 24, wherein securing comprises:

inserting a plurality of fasteners through the stiffener;

inserting the plurality of fasteners through the mounting points; and inserting the plurality of fasteners into the chassis support.

27. The method of claim 24, wherein the printed circuit board is secured between the chassis support and the stiffener using six mounting points.

28. The method of claim 24, further comprising attaching a single piece mounting mechanism to each of the plurality of mounting points.

29. An apparatus, comprising:

means for securing a printed circuit board between a chassis support and a stiffener using a plurality of mounting points; and means for distributing the plurality of mounting points around a periphery of the printed circuit board to redistribute a load on the printed circuit board outside of trace routing areas of the printed circuit board.

30. The apparatus of claim 29, wherein the means for securing comprises a single piece mounting mechanism.

31. The apparatus of claim 29, wherein the means for securing comprises a multiple piece mounting mechanism.

* * * * *